(12) United States Patent
Zhang et al.

(10) Patent No.: US 12,150,291 B2
(45) Date of Patent: Nov. 19, 2024

(54) SEMICONDUCTOR MEMORY DEVICE

(71) Applicant: Fujian Jinhua Integrated Circuit Co., Ltd., Quanzhou (CN)

(72) Inventors: Janbo Zhang, Quanzhou (CN); Yu-Cheng Tung, Quanzhou (CN)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 0 days.

(21) Appl. No.: 18/380,660

(22) Filed: Oct. 17, 2023

(65) Prior Publication Data

US 2024/0049447 A1 Feb. 8, 2024

Related U.S. Application Data

(63) Continuation of application No. 17/528,152, filed on Nov. 16, 2021, now Pat. No. 11,825,644.

(30) Foreign Application Priority Data

Sep. 17, 2021 (CN) .......................... 202111092735.8
Sep. 17, 2021 (CN) .......................... 202122257499.2

(51) Int. Cl.
| | | |
|---|---|---|
| *H01L 27/08* | (2006.01) | |
| *G11C 5/06* | (2006.01) | |
| *H01L 21/762* | (2006.01) | |
| *H10B 12/00* | (2023.01) | |

(52) U.S. Cl.
CPC ............. *H10B 12/31* (2023.02); *G11C 5/063* (2013.01); *H01L 21/76224* (2013.01); *H10B 12/482* (2023.02); *H10B 12/485* (2023.02); *H10B 12/488* (2023.02)

(58) Field of Classification Search
CPC ... H01L 21/76224; G11C 5/063; H10B 12/31; H10B 12/482; H10B 12/485; H10B 12/488; H10B 12/053
See application file for complete search history.

(56) References Cited

U.S. PATENT DOCUMENTS

| | | | |
|---|---|---|---|
| 11,502,087 B2 | 11/2022 | Kim | |
| 11,825,644 B2 * | 11/2023 | Zhang | ................. H10B 12/488 |
| 2014/0061782 A1 | 3/2014 | Kim | |
| 2015/0132942 A1 | 5/2015 | Kim | |
| 2016/0322362 A1 * | 11/2016 | Kim | .................... H10B 12/053 |
| 2018/0108662 A1 | 4/2018 | Cho | |
| 2019/0019795 A1 | 1/2019 | Takesako | |

* cited by examiner

*Primary Examiner* — Shouxiang Hu
(74) *Attorney, Agent, or Firm* — Winston Hsu

(57) ABSTRACT

A semiconductor memory device includes a substrate, at least one word line, a plurality of bit lines and a plurality of insulating structures. The word line is disposed in the substrate, extends along a first direction, and includes a gate cap layer. The bit lines are disposed on the substrate and respectively extend along a second direction. The bit line crosses the word line, and includes a conductive layer. The insulating structures are disposed on the word line and respectively disposed between the bit lines. The bottom surface of the insulating structure is located in the gate cap layer. The area of the top surface of the insulating structure is larger than the area of the bottom surface of the insulating structure.

20 Claims, 19 Drawing Sheets

SEMICONDUCTOR MEMORY DEVICE

CROSS REFERENCE TO RELATED APPLICATIONS

This application is a continuation application of U.S. application Ser. No. 17/528,152, filed on Nov. 16, 2021. The content of the application is incorporated herein by reference.

BACKGROUND OF THE INVENTION

1. Field of the Invention

The present disclosure relates generally to the technical field of semiconductor memory devices, and more particularly to a semiconductor memory device including an insulating structure that isolates storage contacts of capacitors and a fabrication method thereof.

2. Description of the Prior Art

While various electronic products are developed towards miniaturization, the design of units of semiconductor memory devices such as dynamic random access memory (DRAM) should also meet the requirements of high integration density and reduced size. Currently, DRAM with a buried gate structure has been developed, which may have a longer carrier channel length in the same semiconductor substrate, thereby gradually replacing DRAM with a planar gate structure.

A unit of DRAM with a buried gate structure usually includes a transistor component and a charge storage component such as a capacitor to receive the voltage signal from a bit line and a word line. However, since the size of the DRAM unit is reduced and the integration density of the DRAM units is increased, the DRAM with the buried gate structure still has many problems while the manufacturing thereof is limited by the current technology. The component's structural design and the manufacturing method of the DRAM need to be improved to enhance the performance and the reliability of the DRAM.

SUMMARY OF THE INVENTION

The present disclosure provides a semiconductor memory device and a fabrication method thereof. According to embodiments of the present disclosure, the bottom of an insulating structure between the bit lines extends into a gate cap layer of a word line, thereby improving the electrical isolation effect of the insulating structure that isolates storage contacts of capacitors from each other, and avoiding leakage current between the storage contacts of adjacent capacitors. Therefore, for semiconductor memory devices with reduced size of memory units and increased integration density, the performance and the reliability of the semiconductor memory devices are improved.

According to an embodiment of the present disclosure, a semiconductor memory device is provided and includes a substrate, at least one word line, a plurality of bit lines, and a plurality of insulating structures. The word line is disposed in the substrate and extends along a first direction, and the word line includes a gate cap layer. The bit lines are disposed on the substrate and respectively extend along a second direction, where the bit line crosses the word line, and the bit line includes a conductive layer. The insulating structures are disposed on the word line and respectively disposed between the bit lines, where the bottom surface of the insulating structure is located in the gate cap layer, and the area or the width of the cross section of the topmost surface of the insulating structure is greater than the area or the width of the cross section of the bottommost surface of the insulating structure, or greater than the width of a contact surface between the insulating structure and the gate cap layer.

According to an embodiment of the present disclosure, a method of fabricating a semiconductor memory device is provided and includes the following steps. A substrate is provided and a plurality of word lines is formed in the substrate. The word lines extend along a first direction, and the word line includes a gate cap layer. A plurality of bit lines is formed on the substrate. The bit lines extend along a second direction, where the bit line crosses the word lines, and the bit line includes a conductive layer. A plurality of cap layer masks is formed on the bit lines. The cap layer masks extend along the first direction, where a gap is between the adjacent cap layer masks. An etching process is performed to form a plurality of insulating trenches between the cap layer masks and between the bit lines, where the bottom of the insulating trench exposes the gate cap layer. An insulating structure is formed in the insulating trench. The insulating structure includes a lower layer and an upper layer, where the lower layer is a conformally formed layer.

According to the embodiments of the present disclosure, the insulating structure between storage contacts of capacitors is formed under simplifying the fabrication processes. The bottom surface of the insulating structure is located in the gate cap layer. For semiconductor memory devices with a reduced size and a high integration density of memory units, the electrical isolation effect of the insulating structure is enhanced, thereby improving the reliability of the semiconductor memory devices.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features may not be drawn to scale. In fact, the dimensions of the various features may be arbitrarily increased or reduced for clarity of discussion.

DETAILED DESCRIPTION

Figure 1:
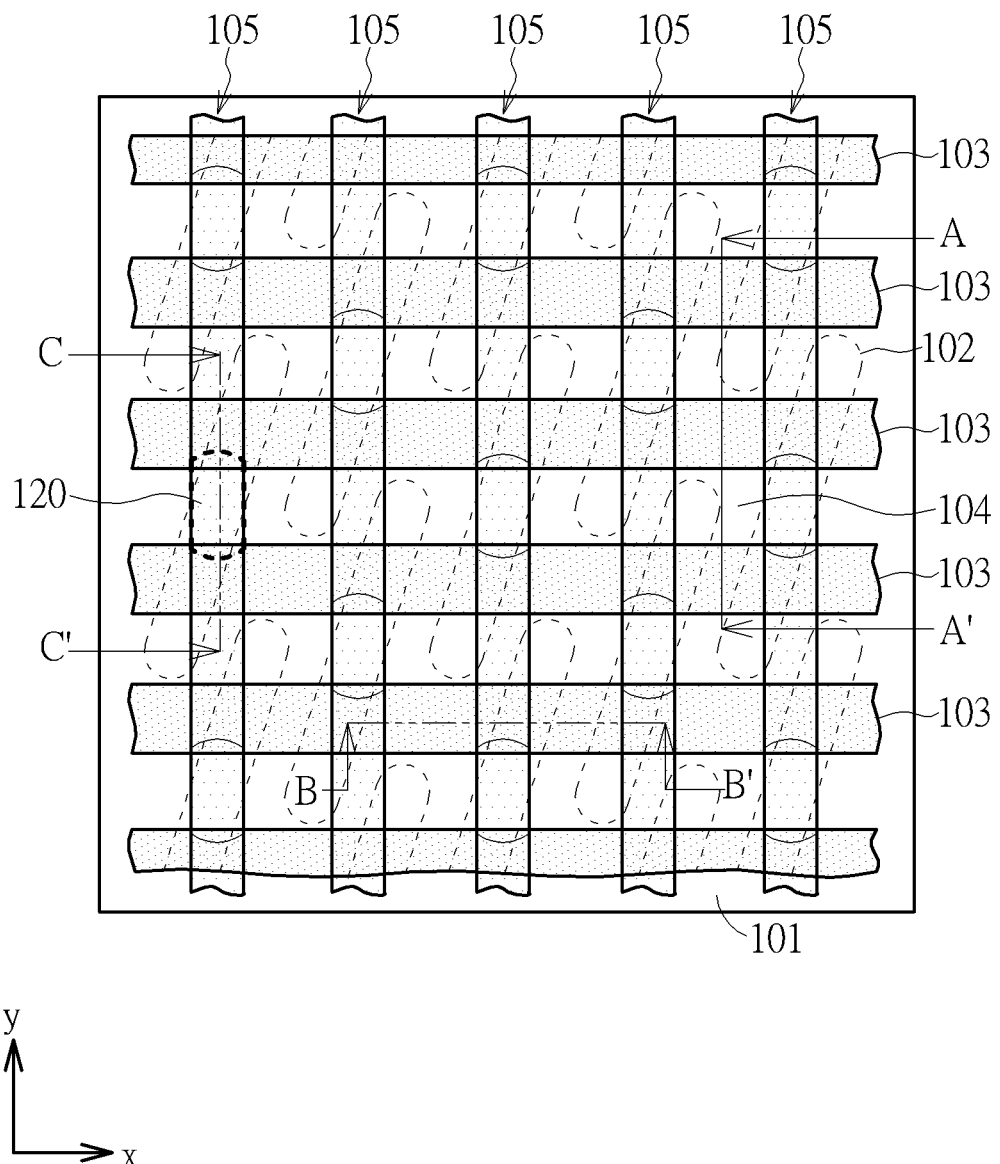
FIG. 1 is a schematic top view of an intermediate stage of forming a semiconductor memory device according to an embodiment of the present disclosure.

In order to well understand the present disclosure, specific embodiments are described in detail in the following. The embodiments of the present disclosure are illustrated with reference numerals in the drawings. In addition, without departing from the spirit of the present disclosure, the technical features in the different embodiments described in the following may be replaced, recombined or mixed with each other to form other embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Although the disclosure is described with respect to specific embodiments, the principles of the disclosure, as defined by the claims appended herein, may obviously be applied beyond the specifically described embodiments of the disclosure described herein. Moreover, in the description of the present disclosure, certain details have been left out in order to not obscure the inventive aspects of the disclosure. The details left out are within the knowledge of a person having ordinary skill in the art.

Please refer to FIG. 1, which illustrates a schematic top view of an intermediate stage of forming a semiconductor memory device according to an embodiment of the present disclosure. First, as shown in FIG. 1, a substrate 101 is provided. The substrate 101 may be, for example, a silicon substrate, a silicon-containing substrate (such as SiC, SiGe), a silicon-on-insulator (SOI) substrate, or other semiconductor substrate. The substrate 101 may include multiple active regions 102, and each active region 102 may be surrounded by an isolation region in the substrate 101, such as a shallow trench isolation structure 104, so that the adjacent active regions 102 are separated from each other by the shallow trench isolation structure 104. The active regions 102 may be, for example, parallel to and spaced apart from each other, and exhibit an array arrangement as shown in FIG. 1, but not limited thereto. A plurality of word lines 103 is formed in the substrate 101, and these word lines 103 are parallel to each other and respectively extend along a first direction (for example, the x-direction shown in FIG. 1). Each word line 103 may be a buried word line (BWL). The word line 103 may be formed by etching the substrate 101 to form a word line trench therein, and filling the word line trench with the materials of a gate dielectric layer, a gate electrode and a gate cap layer. A plurality of bit lines 105 is also formed on the substrate 101. These bit lines 105 are parallel to each other and respectively extend along a second direction (for example, the y-direction shown in FIG. 1). Each bit line 105 crosses the word lines 103, and the bit line 105 includes a conductive layer and a bit line hard mask disposed on the conductive layer. In addition, a bit line contact 120 is disposed under the bit line 105 where the bit line 105 overlaps the active region 102. The bit line contact 120 electrically connects the bit line 105 to the active region 102.

Figure 2:
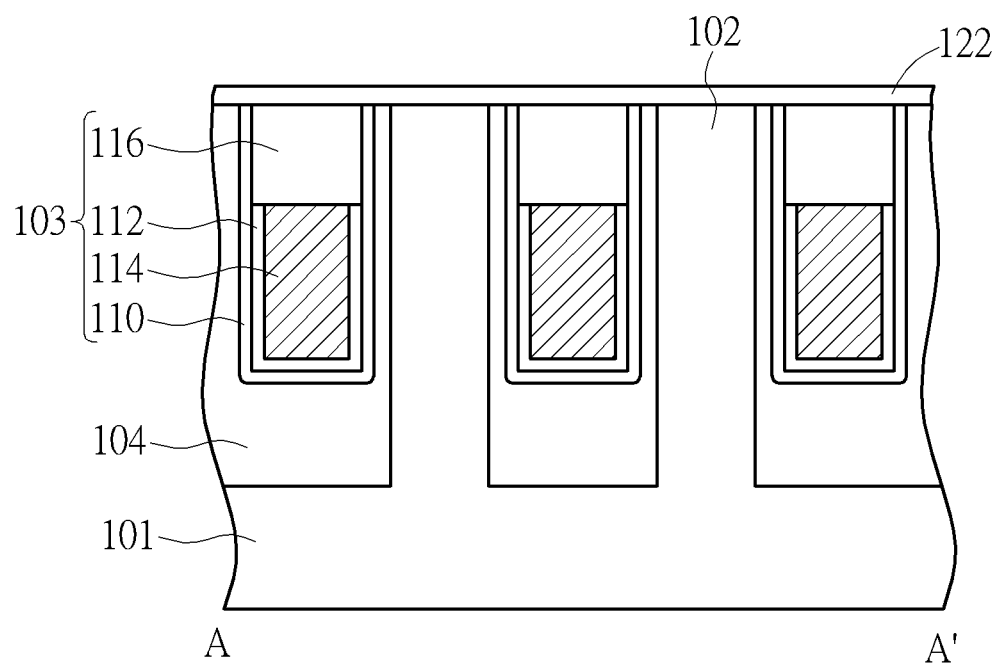
FIG. 2 is a schematic cross-sectional view of an intermediate stage of forming the semiconductor memory device along the section line A-A' of FIG. 1 according to an embodiment of the present disclosure.

FIG. 2 illustrates a schematic cross-sectional view of an intermediate stage of forming a semiconductor memory device along the section line A-A' of FIG. 1 according to an embodiment of the present disclosure. As shown in FIG. 2, along the section line A-A' of FIG. 1, the word line 103 is buried in the substrate 101 and in the shallow trench isolation structure 104. The word line 103 includes a gate dielectric layer 112, a gate electrode 114 and a gate cap layer 116 that are buried in the word line trench in the substrate 101, and an insulating liner 110 may be conformally formed on the inner sidewalls and the bottom surface of the word line trench. An insulating layer 122 may cover the active regions 102, the word lines 103 and the shallow trench isolation structures 104. The gate dielectric layer 112 is conformally formed on the insulating liner 110 and is disposed at a lower portion of the word line trench. The gate electrode 114 fills the lower portion of the word line trench, and the gate cap layer 116 is disposed on the gate dielectric layer 112 and the gate electrode 114 to fill an upper portion of the word line trench. The top surface of the gate cap layer 116 and the top surface of the active region 102 may be substantially on the same plane. The material of the insulating liner 110 may be, for example, silicon oxide, silicon nitride, silicon oxynitride or a combination thereof. The material of the gate dielectric layer 112 may be, for example, silicon oxide or other dielectric materials with a higher dielectric constant than that of silicon oxide, such as aluminum oxide. The material of the gate electrode 114 may be, for example, doped polysilicon, metal or other conductive materials. The material of the gate cap layer 116 may be, for example, silicon nitride, silicon oxynitride or other suitable insulating materials. The gate cap layer 116 may be used to protect the gate electrode 114 and avoid unnecessary electrical connection between the gate electrode 114 and a subsequently formed component, such as a storage contact of a capacitor. The material of the insulating layer 122 includes, for example, an oxide-nitride-oxide (ONO) structure, but not limited thereto. The insulating layer 122 may be used to protect the active regions 102 and prevent the structure of the active regions 102 from being damaged by the subsequent processes of forming the semiconductor memory device.

Figure 3:
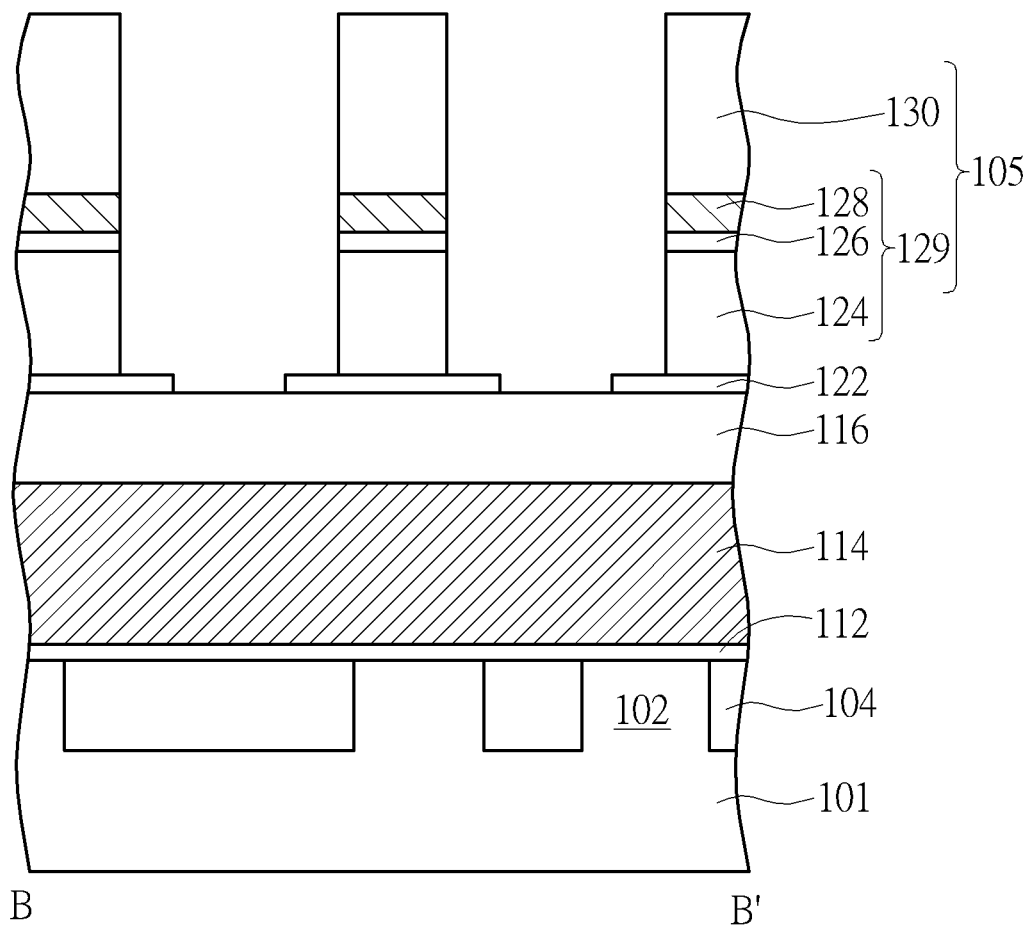
FIG. 3 is a schematic cross-sectional view of the intermediate stage of forming the semiconductor memory device along the section line B-B' of FIG. 1 according to an embodiment of the present disclosure.

FIG. 3 illustrates a schematic cross-sectional view of the intermediate stage of forming the semiconductor memory device along the section line B-B' of FIG. 1 according to an embodiment of the present disclosure. As shown in FIG. 3, along the section line B-B' of FIG. 1, the bit lines 105 cross the word line 103, and the bit lines 105 are disposed on the word line 103. The insulating layer 122 is disposed between the bit line 105 and the word line 103. The insulating layer 122 includes, for example, an oxide-nitride-oxide (ONO) structure, but not limited thereto. Each bit line 105 includes a conductive layer 129 and a bit line hard mask 130 disposed on the conductive layer 129. The conductive layer 129 includes a semiconductor layer 124, a barrier layer 126, and a metal layer 128, which are stacked on the insulating layer 122 in sequence from bottom to top. The material of the semiconductor layer 124 may be, for example, polysilicon. The material of the barrier layer 126 may be, for example, titanium nitride (TiN), tantalum nitride (TaN) or other suitable barrier materials to isolate a semiconductor material from a metal material. The material of the metal layer 128 may be, for example, aluminum (Al), tungsten (W), or other suitable metals or metal alloys. The material of the bit line hard mask 130 may be, for example, silicon nitride, silicon oxynitride, a combination thereof, or other suitable insulating materials. According to an embodiment of the present disclosure, the width of each insulating layer 122 is wider than the width of the bit line 105 that is disposed above the insulating layer 122, so that a portion of the insulating layer 122 may not be covered by the bit line 105.

Figure 4:
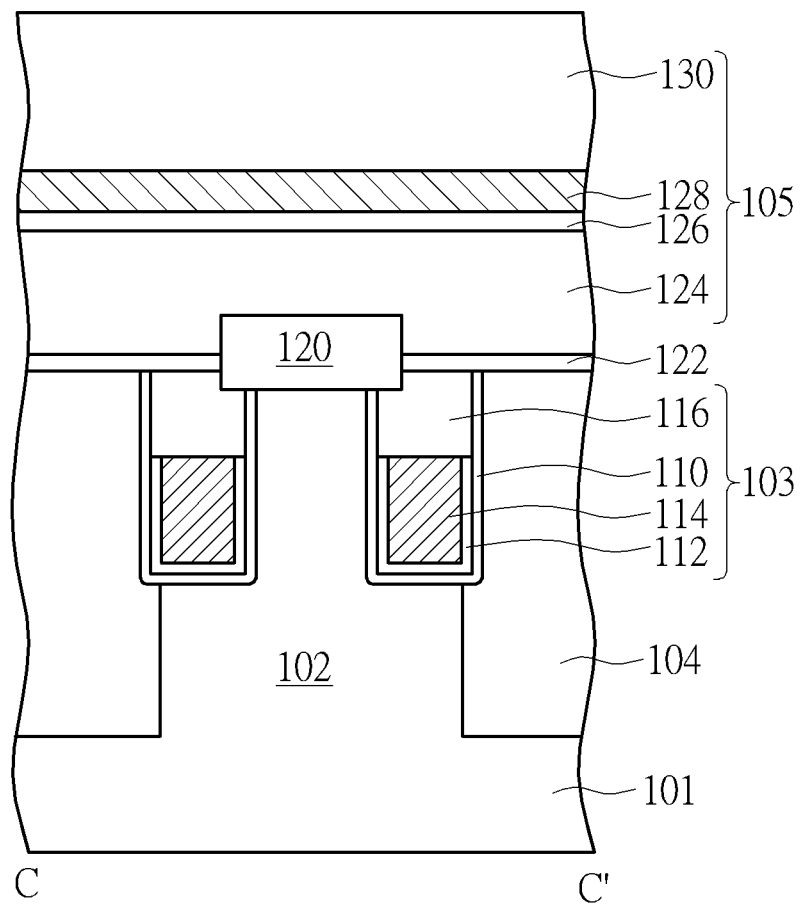
FIG. 4 is a schematic cross-sectional view of the intermediate stage of forming the semiconductor memory device along the section line C-C' of FIG. 1 according to an embodiment of the present disclosure.

FIG. 4 illustrates a schematic cross-sectional view of the intermediate stage of forming the semiconductor memory device along the section line C-C' of FIG. 1 according to an embodiment of the present disclosure. As shown in FIG. 4, along the section line C-C' of FIG. 1, the bit line 105 crosses two word lines 103 that are disposed in one active region 102, and the bit line 105 is disposed on the word lines 103. In addition, the bit line contact 120 is disposed between the bit line 105 and the active region 102, passes through the insulating layer 122, and contacts the active region 102 between the two word lines 103. The bit line contact 120 may electrically couple the bit line 105 to the active region 102, such as a source/drain region between the two word lines 103. The material of the bit line contact 120 may be, for example, polysilicon. The material of the bit line contact 120 may be the same as the material of the semiconductor layer 124 of the bit line 105, and the bit line contact 120 and the semiconductor layer 124 of the bit line 105 may be formed by the same process. In one embodiment, an etching process may be used to form a recess in the active region 102 between the two word lines 103, and the bit line contact 120 is formed in the recess during the deposition process of forming the semiconductor layer 124.

Figure 5:
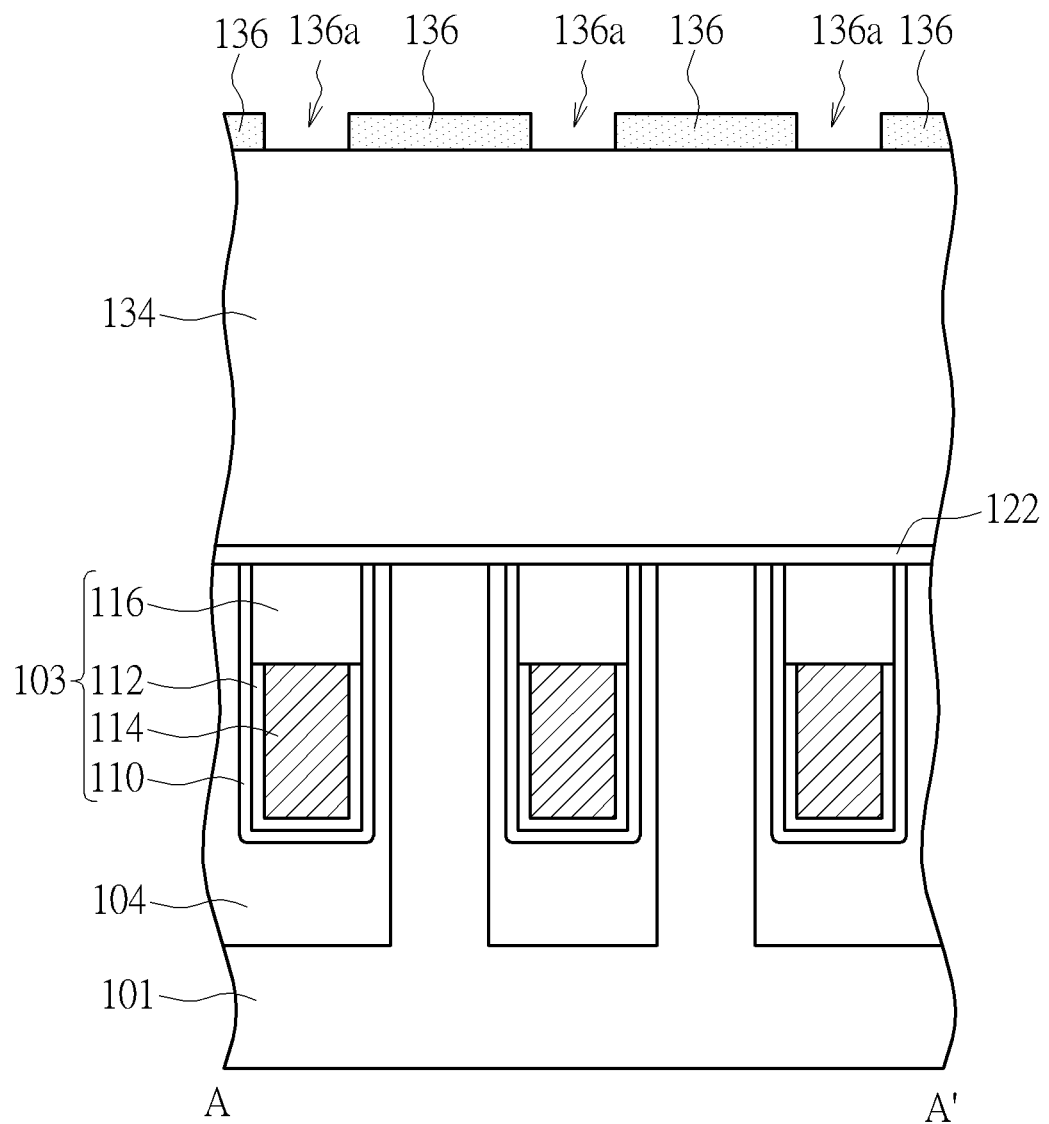
FIG. 5 is a schematic cross-sectional view of an intermediate stage of forming the semiconductor memory device along the section line A-A' of FIG. 1 according to an embodiment of the present disclosure, where a plurality of cap layer masks is formed.

FIG. 5 illustrates a schematic cross-sectional view of an intermediate stage of forming the semiconductor memory device along the section line A-A' of FIG. 1 according to an embodiment of the present disclosure, where a plurality of cap layer masks is formed. As shown in FIG. 5, along the section line A-A' of FIG. 1, after the bit lines 105 are formed, an insulating filling material 134 is formed above the word lines 103 and between the bit lines 105, and then a plurality of cap layer masks 136 is formed on the insulating filling material 134. The cap layer masks 136 respectively extend along the first direction (for example, the x-direction shown in FIG. 1). There are gaps 136a respectively between the adjacent cap layer masks 136, and each gap 136a also extends along the first direction (for example, the x-direction shown in FIG. 1). In the top view direction, the position of the gap 136a substantially corresponds to the position of the word line 103. The insulating filling material 134 may be an organic insulating material or an inorganic insulating material, such as silicon oxide. The material of the cap layer mask 136 may be, for example, silicon nitride. There is an etch selectivity ratio between the insulating filling material 134 and the cap layer mask 136 (the etching rate of the insulating filling material 134 is greater than the etching rate of the cap layer mask 136), so that in the subsequent etching process, a portion of the insulating filling material 134 exposed by the cap layer masks 136 is removed.

Figure 6:
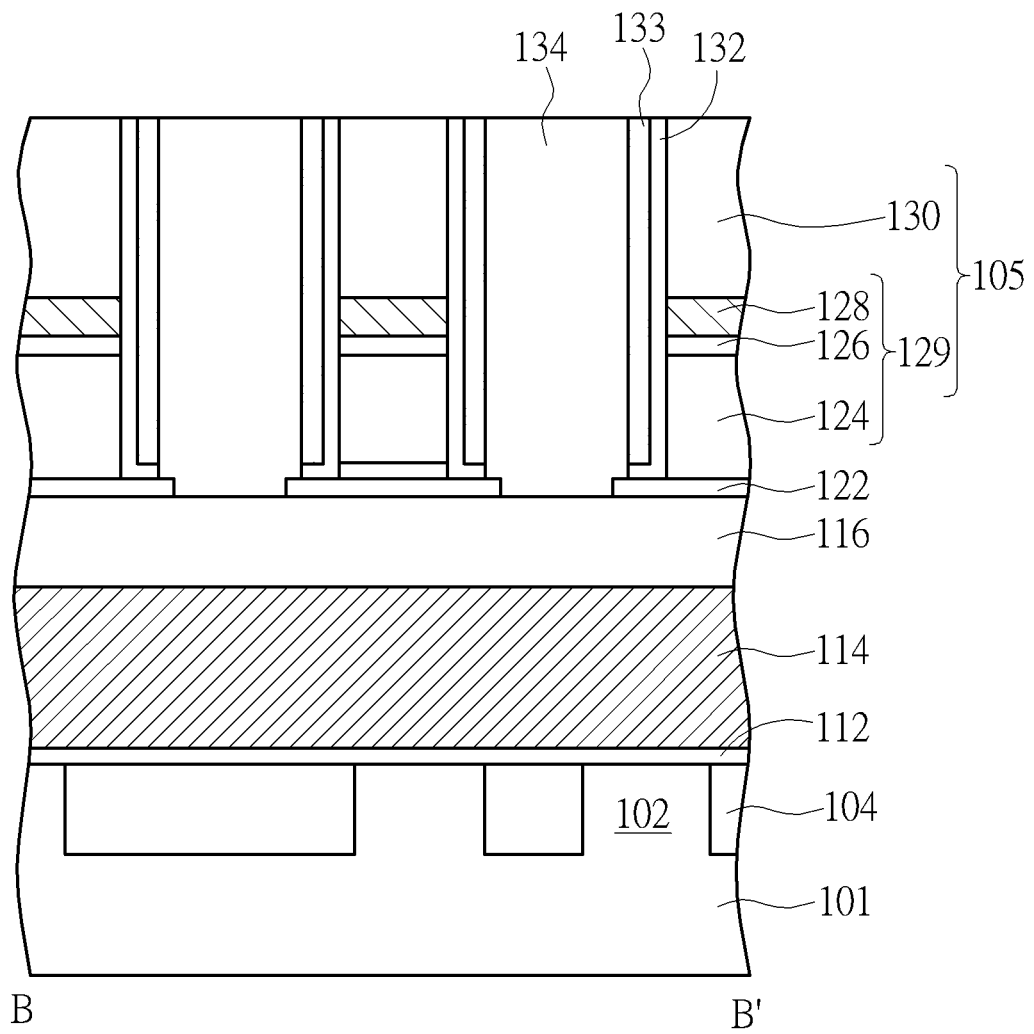
FIG. 6 is a schematic cross-sectional view of the intermediate stage of forming the semiconductor memory device along the section line B-B' of FIG. 1 according to an embodiment of the present disclosure, where a spacer is formed on the sidewall of the bit line.

FIG. 6 illustrates a schematic cross-sectional view of the intermediate stage of forming the semiconductor memory device along the section line B-B' of FIG. 1 according to an embodiment of the present disclosure, where a spacer layer on the sidewalls of the bit line is formed. As shown in FIG. 6, along the section line B-B' of FIG. 1, after the bit lines 105 are formed, an insulating liner 132 and a spacer layer 133 are formed in sequence on the sidewalls of the bit line 105. The material of the insulating liner 132 may be, for example, silicon nitride or silicon oxynitride. The material of the spacer layer 133 may be, for example, silicon oxide. The insulating liner layer 132 and the spacer layer 133 may also be collectively referred to as a spacer on the sidewalls of the bit line 105. The insulating liner 132 and the spacer layer 133 may be deposited on the top surface and the sidewalls of the bit line 105 and on the bottom surface of the gap between the bit lines 105, and then the portions of the insulating liner 132 and the spacer layer 133 on the top surface of the bit line 105 and on the bottom surface of the gap between the bit lines 105 are removed through an etching process to leave the spacer on the sidewalls of the bit line 105. According to an embodiment of the present disclosure, each insulating layer 122 may be exposed from the insulating liner 132 and the spacer layer 133 by performing suitable processes, so that a portion of the insulating layer 122 is not covered by the insulating liner 132 and the spacer layer 133. Thereafter, the insulating filling material 134 fills the gap between the bit lines 105 and covers the spacers on the sidewalls of the bit lines 105. The top surface of the insulating filling material 134 may be substantially on the same level as the top surface of the bit line hard mask 130. According to the embodiments of the present disclosure, before forming the cap layer masks 136, the spacers have been formed on the sidewalls of each bit line 105.

Figure 7:
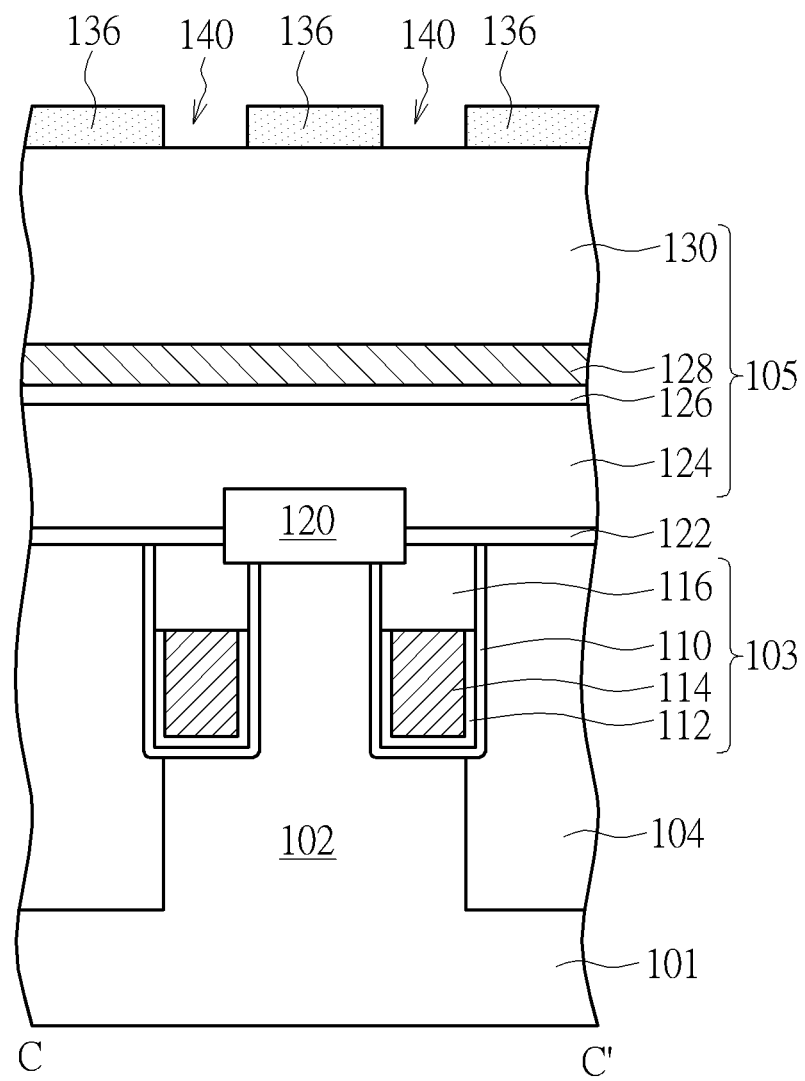
FIG. 7 is a schematic cross-sectional view of the intermediate stage of forming the semiconductor memory device along the section line C-C' of FIG. 1 according to an embodiment of the present disclosure, where the cap layer masks are formed.

FIG. 7 illustrates a schematic cross-sectional view of the intermediate stage of forming the semiconductor memory device along the section line C-C' of FIG. 1 according to an embodiment of the present disclosure, where a plurality of cap layer masks is formed. As shown in FIG. 7, along the section line C-C' of FIG. 1, after the bit lines 105 are formed, a plurality of cap layer masks 136 is formed on the bit line hard mask 130. These cap layer masks 136 respectively extend along the first direction (for example, the x-direction shown in FIG. 1) and cross the bit lines 105. The gap 136a between the adjacent cap layer masks 136 also extends along the first direction (for example, the x-direction shown in FIG. 1). In the top view direction, each gap 136a is disposed directly above each word line 103. According to an embodiment of the present disclosure, before forming the cap layer masks 136, the bit line contacts 120 have been formed under the bit lines 105.

Figure 8:
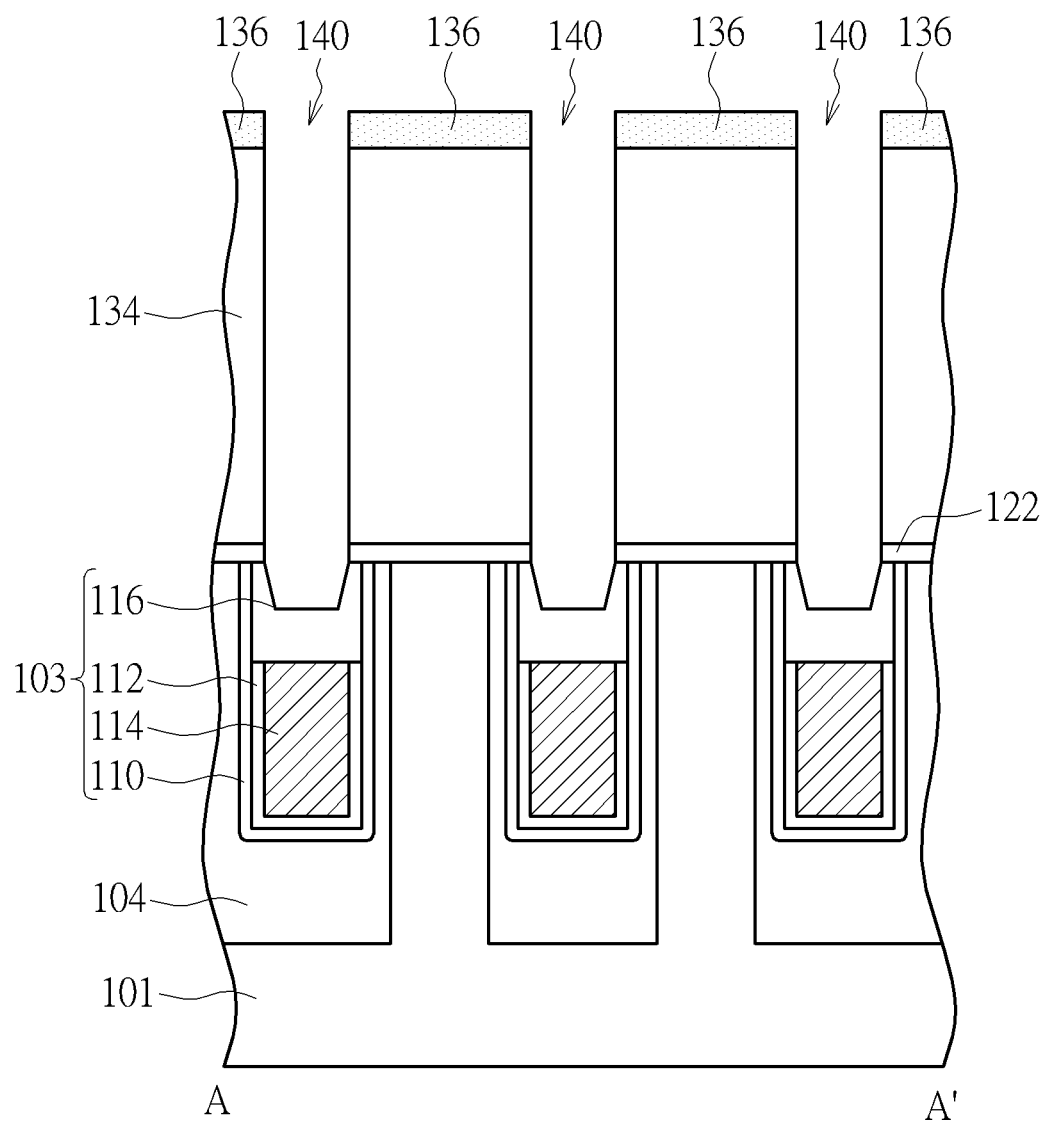
FIG. 8 is a schematic cross-sectional view of an intermediate stage of forming the semiconductor memory device along the section line A-A' of FIG. 1 according to an embodiment of the present disclosure, where a plurality of insulating trenches is formed.

FIG. 8 illustrates a schematic cross-sectional view of an intermediate stage of forming the semiconductor memory device along the section line A-A' of FIG. 1 according to an embodiment of the present disclosure, where a plurality of insulating trenches is formed. As shown in FIG. 8, the cap layer masks 136 are used as an etching mask to perform an etching process to etch a portion of the insulating filling material 134 that is exposed from the gap 136a between the adjacent cap layer masks 136. According to the embodiments of the present disclosure, the etching process further etches into the gate cap layer 116 of the word line 103 to form a plurality of insulating trenches 140, where the cross-sectional shape of the bottom of each insulating trench 140 in the gate cap layer 116 is a trapezoid with a wide top and a narrow bottom. The bottom of each insulating trench 140 exposes each gate cap layer 116. The above-mentioned etching process may be a wet etching or a dry etching process. Along the section line A-A' in FIG. 1, the insulating trenches 140 are formed between the cap layer masks 136. In the top view direction, the insulating trench 140 is substantially directly above the word line 103. According to embodiments of the present disclosure, on the section line A-A' of FIG. 1, the cross-sectional shape of the bottom of each insulating trench 140 in the gate cap layer 116 is not limited to a trapezoid with a wide top and a narrow bottom, and may also be any geometric shapes with a wide top and a narrow bottom.

Figure 9:
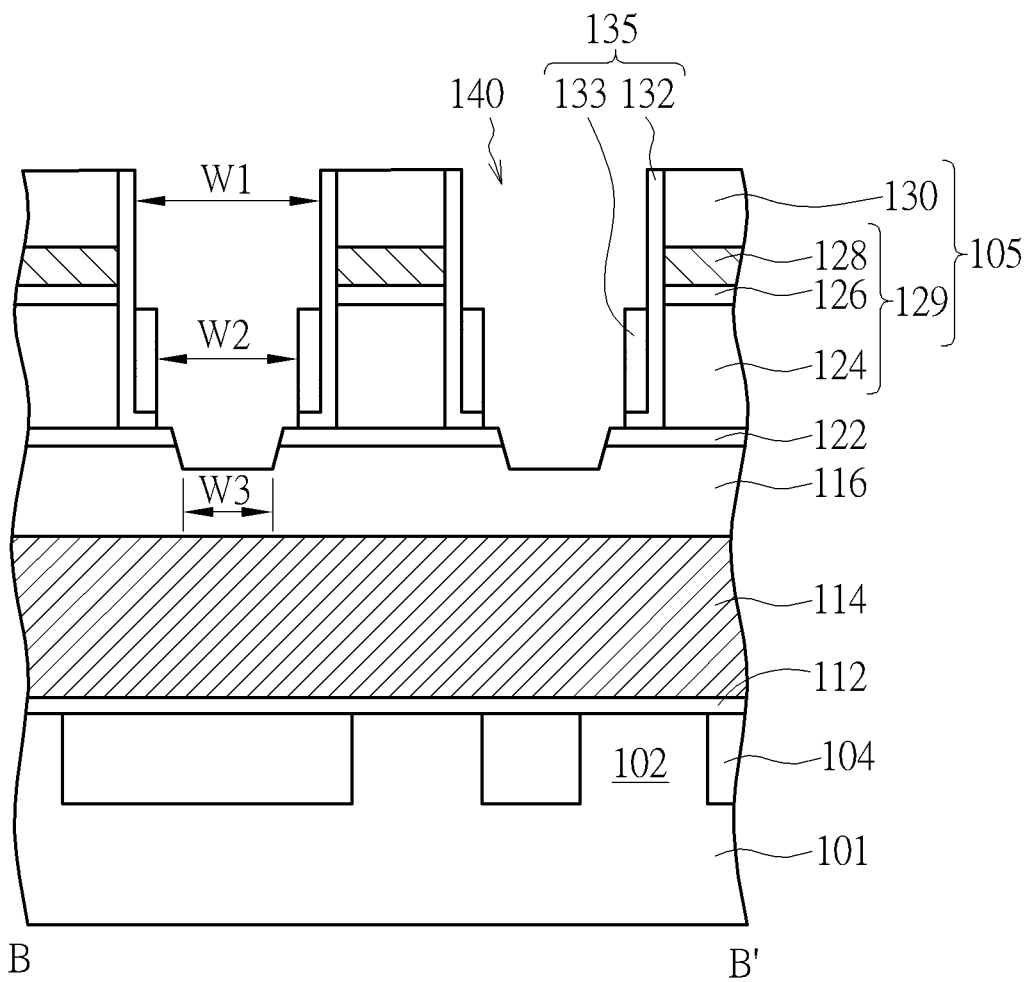
FIG. 9 is a schematic cross-sectional view of the intermediate stage of forming the semiconductor memory device along the section line B-B' of FIG. 1 according to an embodiment of the present disclosure, where the insulating trenches are formed.

FIG. 9 illustrates a schematic cross-sectional view of the intermediate stage of forming the semiconductor memory device along the section line B-B' of FIG. 1 according to an embodiment of the present disclosure, where the insulating trenches are formed. The process stage of FIG. 9 is the same as the process stage of FIG. 8. According to an embodiment of the present disclosure, the etching process of forming the insulating trenches 140 completely removes an upper portion of the spacer layer 133 on the sidewalls of the bit line 105, or may further remove an upper portion of the insulating liner 132 on the sidewalls of the bit line 105. The remaining lower portion of the spacer layer 133 and the insulating liner 132 together form a spacer 135. As shown in FIG. 9, the thickness of the spacer 135 is gradually decreased from top to bottom, or the thickness of the upper portion of the spacer 135 is less than the thickness of the lower portion thereof. In addition, the etching process of forming the insulating trenches 140 also removes the insulating filling material 134 between the bit lines 105. The spacer 135 and the exposed insulating layer 122 are used as an etching mask to further remove a portion of the gate cap layer 116, and the bottom of the insulating trench 140 having a trapezoidal cross-section with a wide top and a narrow bottom is formed in the gate cap layer 116. As shown in FIG. 9, along the section line B-B' of FIG. 1, each of the insulating trenches 140 is formed between the adjacent bit lines 105. According to an embodiment of the present disclosure, the insulating trenches 140 are formed between the cap layer masks 136 and between the bit lines 105. In addition, the upper portion of each insulating trench 140 has a first width W1, the middle portion of each insulating trench 140 has a second width W2, and the bottom portion of each insulating trench 140 has a third width W3. According to an embodiment of the present disclosure, the first width W1 is greater than the second width W2, and the second width W2 is greater than the third width W3, so that the area or the width of the cross section of the topmost surface (opening) of each insulating trench 140 is greater than the area or the width of the cross section of the bottommost surface of each insulating trench 140, or greater than the width of the contact surface between each insulating trench 140 and the gate cap layer 116. According to an embodiment of the present disclosure, on the section line B-B' of FIG. 1, the cross-sectional shape of the bottom of each insulating trench 140 in the gate cap layer 116 is not limited to a trapezoid with a wide upper and a narrow bottom, and may also be any geometric shapes with a wide upper and a narrow bottom.

Figure 10:
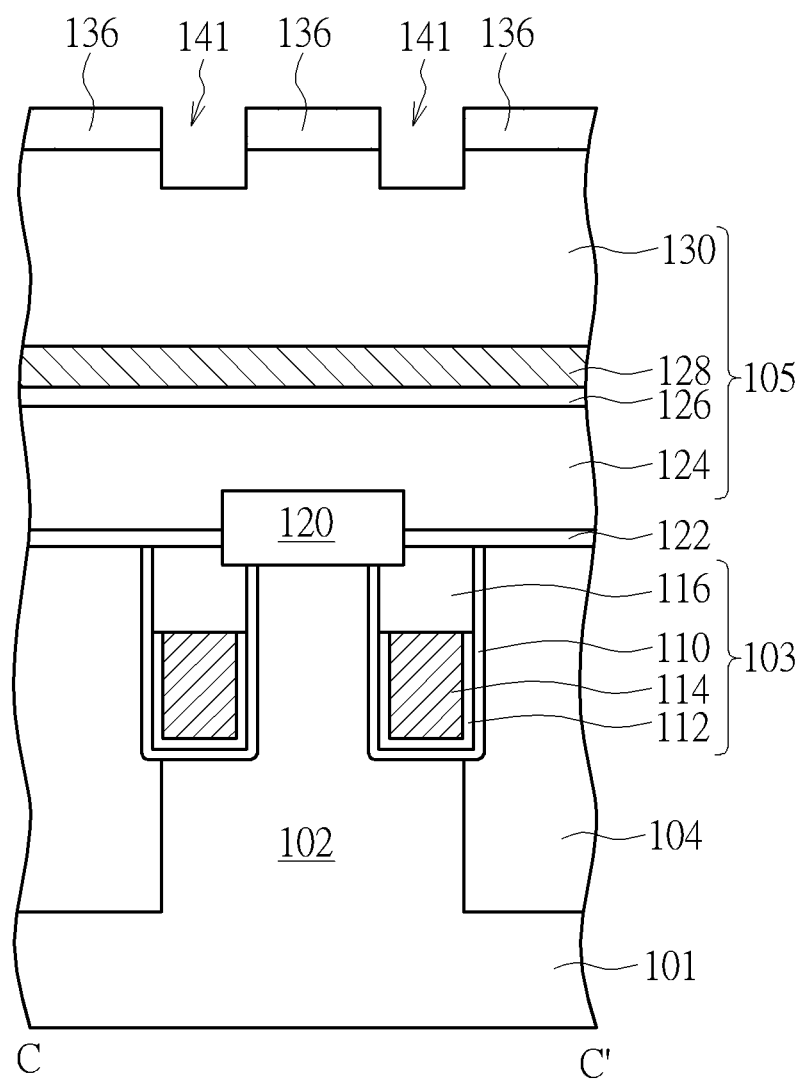
FIG. 10 is a schematic cross-sectional view of the intermediate stage of forming the semiconductor memory device along the section line C-C' of FIG. 1 according to an embodiment of the present disclosure, where a recess on a bit line hard mask is formed.

FIG. 10 illustrates a schematic cross-sectional view of the intermediate stage of forming the semiconductor memory device along the cross-sectional line C-C' of FIG. 1 according to an embodiment of the present disclosure, where a recess is formed on the bit line hard mask. The process stage of FIG. 10 is the same as the process stage of FIG. 8 and FIG. 9. As shown in FIG. 10, the etching process of forming the insulating trenches 140 removes the exposed bit line hard mask 130, so that a portion of the top surface of the bit line hard mask 130 of the bit line 105 is recessed to form a recess 141 on the bit line hard mask 130.

Figure 11:
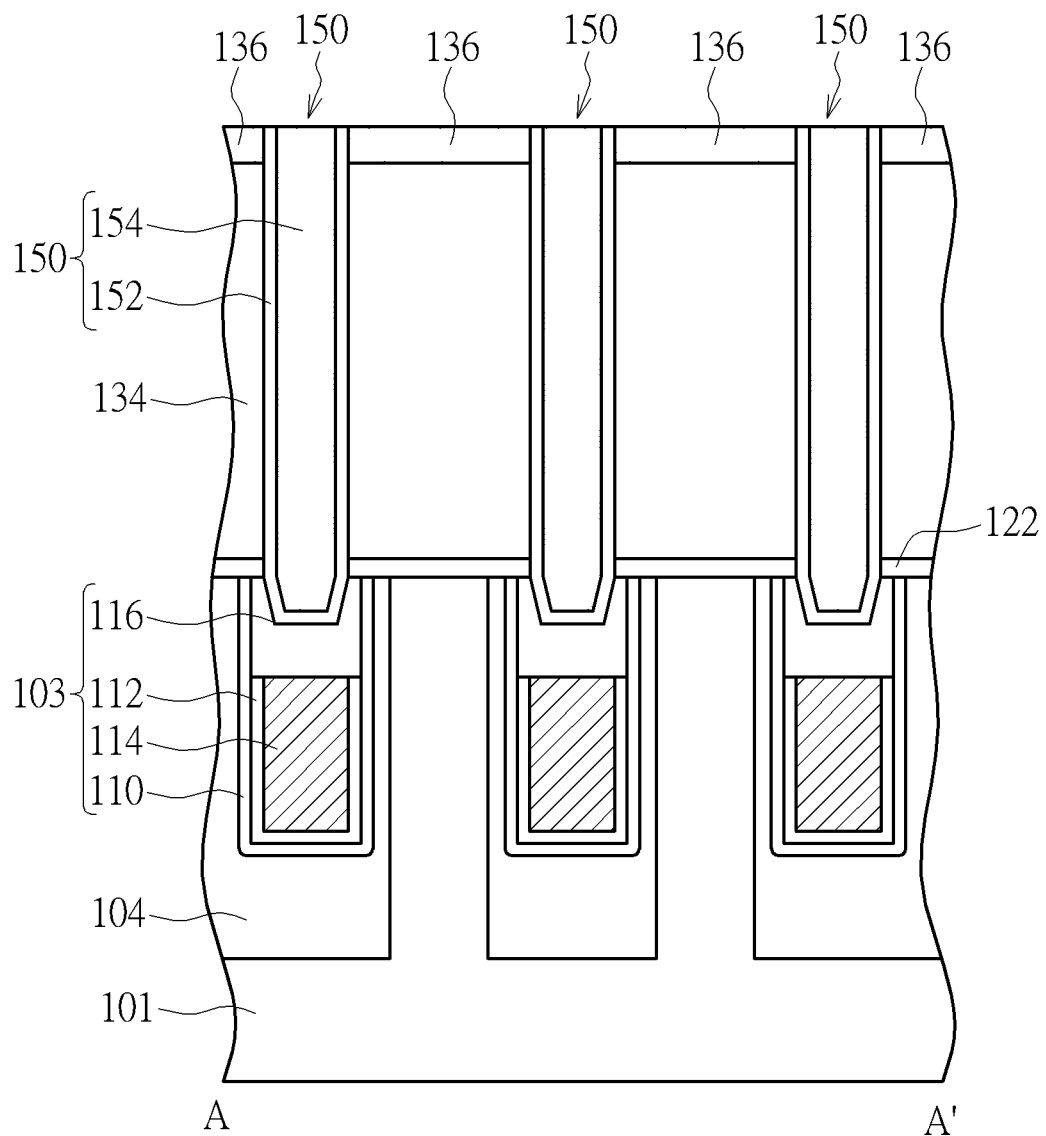
FIG. 11 is a schematic cross-sectional view of an intermediate stage of forming the semiconductor memory device along the section line A-A' of FIG. 1 according to an embodiment of the present disclosure, where a plurality of insulating structures is formed.

FIG. 11 illustrates a schematic cross-sectional view of an intermediate stage of forming the semiconductor memory device along the section line A-A' of FIG. 1 according to an embodiment of the present disclosure, where a plurality of insulating structures is formed. As shown in FIG. 11, according to an embodiment of the present disclosure, after the insulating trenches 140 are formed, an insulating structure 150 is formed in each insulating trench 140. The insulating structure 150 may be a stacked structure, including a lower layer 152 that is conformally formed on the sidewalls and the bottom surface of the insulating trench 140, and an upper layer 154 filling the insulating trench 140. The material of the lower layer 152 may be, for example, silicon nitride, silicon oxide, silicon oxynitride, or a combination thereof. The lower layer 152 may be formed by an atomic layer deposition (ALD), a chemical vapor deposition (CVD), or a physical vapor deposition (PVD) process. The material of the upper layer 154 may be an organic insulating material or an inorganic insulating material. The organic insulating material may be, for example, polycarbonate (PC), polyethylene terephthalate (PET), or other suitable organic insulating materials. The inorganic insulating material may be, for example, silicon oxide. The upper layer 154 may be formed by a flowable chemical vapor deposition (FCVD), a PVD, or a coating process. According to the embodiments of the present disclosure, the bottom of each insulating structure 150 is buried in the gate cap layer 116 of the word line 103, and each insulating structure 150 directly contacts the gate cap layer 116, so that the bottom surface of each insulating structure 150 is located in the gate cap layer 116, and the bottom surface of each insulating structure 150 is higher than the bottom surface of the gate cap layer 116. Therefore, each insulating structure 150 does not contact the gate electrode 114. In addition, the area or the width of the cross section of the bottom of each insulating structure 150 is gradually decreased from top to bottom, for example, the bottom of each insulating structure 150 may have a trapezoidal cross-section with a wide top and a narrow bottom, or a cross-section with other geometric shapes. The area or the width of the cross section of the topmost surface of each insulating structure 150 is greater than the area or the width of the cross section of the bottommost surface of each insulating structure 150, or greater than the width of the contact surface between each insulating structure 150 and the gate cap layer 116.

Figure 12:
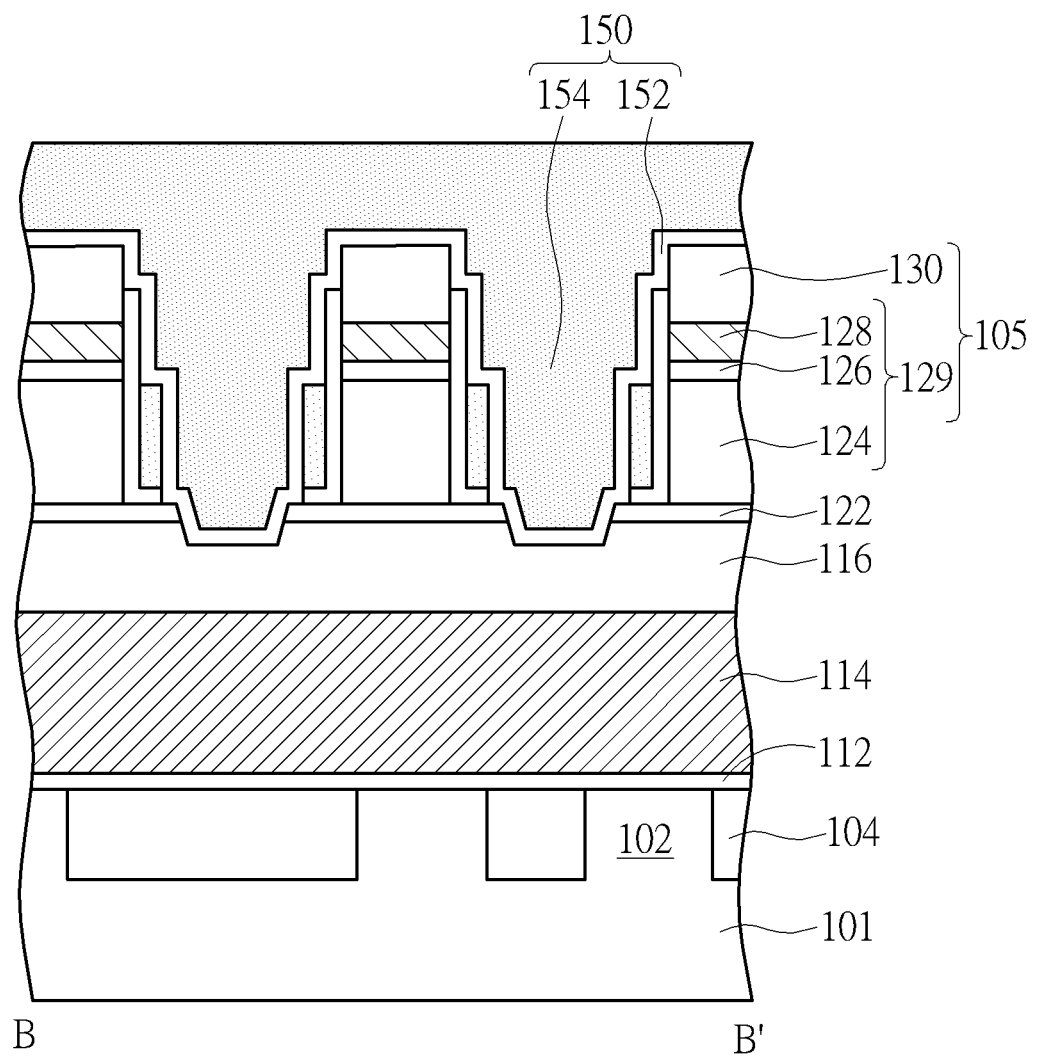
FIG. 12 is a schematic cross-sectional view of the intermediate stage of forming the semiconductor memory device along the section line B-B' of FIG. 1 according to an embodiment of the present disclosure, where the insulating structures are formed.

FIG. 12 illustrates a schematic cross-sectional view of the intermediate stage of forming the semiconductor memory device along the section line B-B' of FIG. 1 according to an embodiment of the present disclosure, where the insulating structures are formed. The process stage of FIG. 12 is the same as that of FIG. 11. As shown in FIG. 12, the lower layer 152 of the insulating structure 150 is conformally formed on the top surfaces of the bit line hard masks 130, the sidewalls of the spacers 135, the exposed surface of the insulating layer 122 and the bottom surfaces of the insulating trenches 140, and the upper layer 154 of the insulating structure 150 covers the lower layer 152. The bottom of the insulating structure 150 buried in the gate cap layer 116 includes the conformally formed lower layer 152 and the upper layer 154 that fills the insulating trench. Along the section line B-B' of FIG. 1, the bottom of the insulating structure 150 has a trapezoidal cross-section with a wide top and a narrow bottom, or a cross-section with other geometric shapes. Alternatively, when the upper portion of the insulating liner 132 on the sidewalls of the bit line 105 is removed, each insulating structure 150 (for example, the lower layer 152) may directly contact the sidewalls of the bit line 105 (for example, the bit line hard mask 130).

Figure 13:
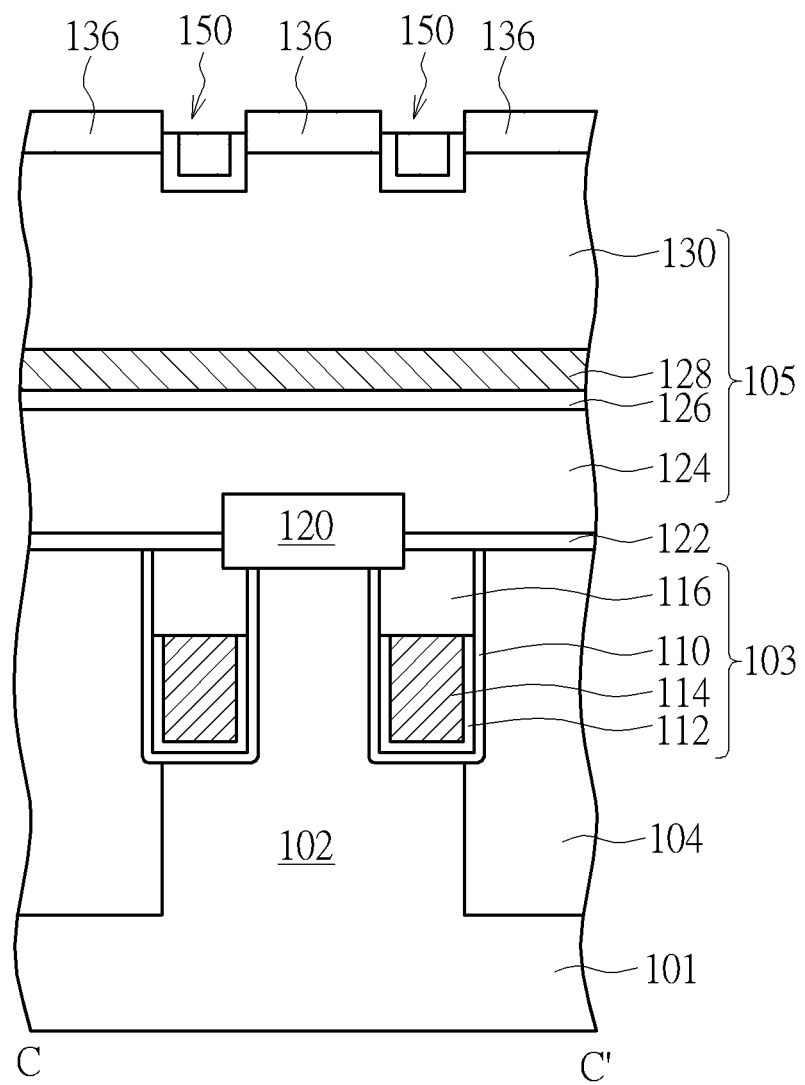
FIG. 13 is a schematic cross-sectional view of the intermediate stage of forming the semiconductor memory device along the section line C-C' of FIG. 1 according to an embodiment of the present disclosure, where the material of the insulating structure fills the recess on the bit line hard mask.

FIG. 13 illustrates a schematic cross-sectional view of the intermediate stage of forming the semiconductor memory device along the section line C-C' of FIG. 1 according to an embodiment of the present disclosure, where the material of the insulating structure fills the recesses on the bit line hard mask. The process stage of FIG. 13 is the same as the process stage of FIG. 11 and FIG. 12. As shown in FIG. 13, the material of the insulating structure 150 fills the recesses on a partial top surface of the bit line hard mask 130. The top surface of the material of the insulating structure 150 filling the recess may be slightly lower than the top surface of the cap layer mask 136, or on the same level as the top surface of the cap layer mask 136.

Figure 14:
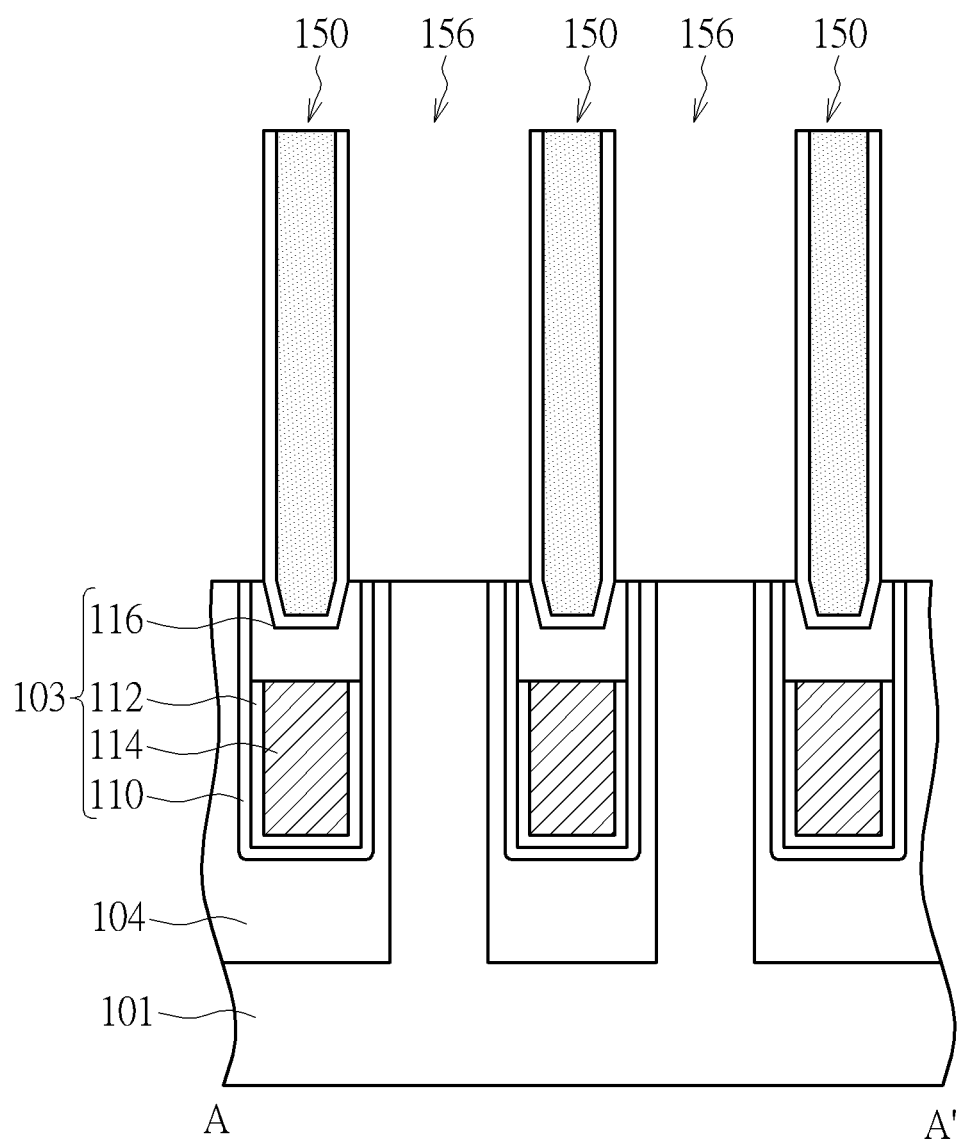
FIG. 14 is a schematic cross-sectional view of an intermediate stage of forming the semiconductor memory device along the section line A-A' of FIG. 1 according to an embodiment of the present disclosure, where the cap layer masks and the filling insulating material are removed.

FIG. 14 illustrates a schematic cross-sectional view of an intermediate stage of forming the semiconductor memory device along the section line A-A' of FIG. 1 according to an embodiment of the present disclosure, where the cap layer masks and the insulating filling material are removed. As shown in FIG. 14, after the insulating structures 150 are formed, the cap layer masks 136 and the insulating filling material 134 are removed, and trenches 156 between the adjacent insulating structures 150 are formed to expose the active regions 102. The cap layer masks 136 and the insulating filling material 134 may be removed by a wet etching or a dry etching process. In the top view direction, these trenches 156 are respectively located between the adjacent word lines 103.

Figure 15:
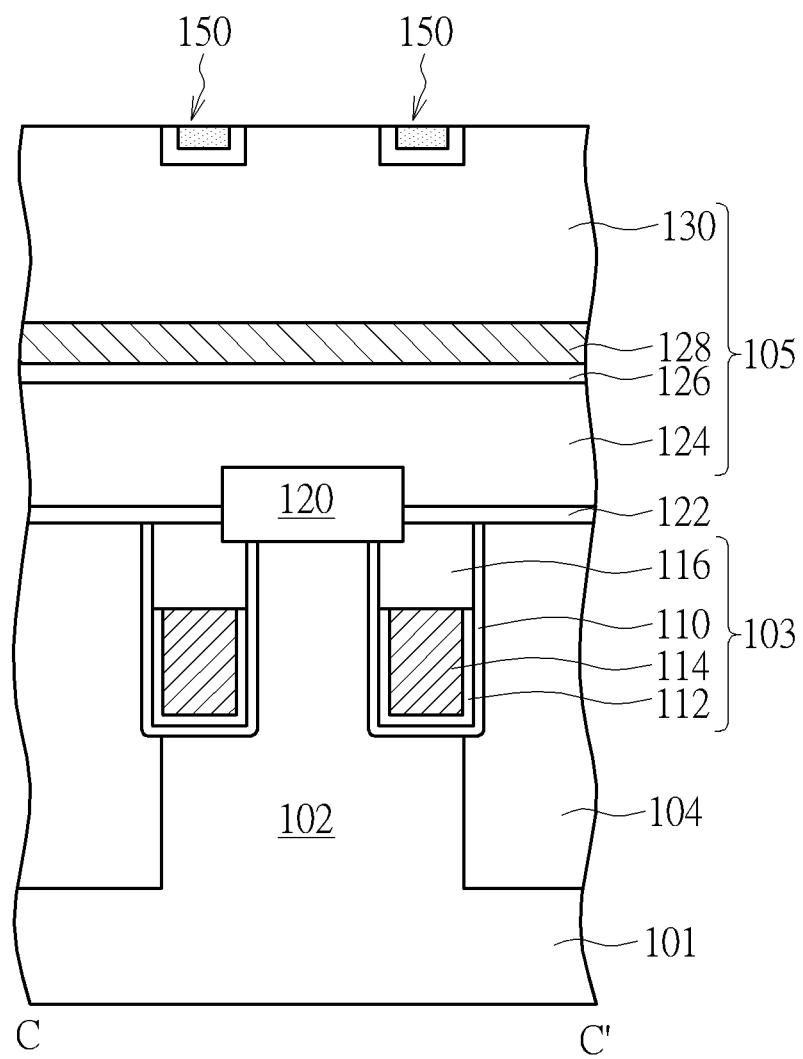
FIG. 15 is a schematic cross-sectional view of the intermediate stage of forming the semiconductor memory device along the section line C-C' of FIG. 1 according to an embodiment of the present disclosure, where the cap layer masks are removed.

FIG. 15 illustrates a schematic cross-sectional view of the intermediate stage of forming the semiconductor memory device along the section line C-C' of FIG. 1 according to an embodiment of the present disclosure, where the cap layer masks are removed. The process stage of FIG. 15 is the same as the process stage of FIG. 14. As shown in FIG. 15, after the cap layer masks 136 are removed, the top surface of the material of the insulating structure 150 filling the recess on a partial top surface of the bit line hard mask 130 may be substantially on the same level as the top surface of the bit line hard mask 130.

Figure 16:
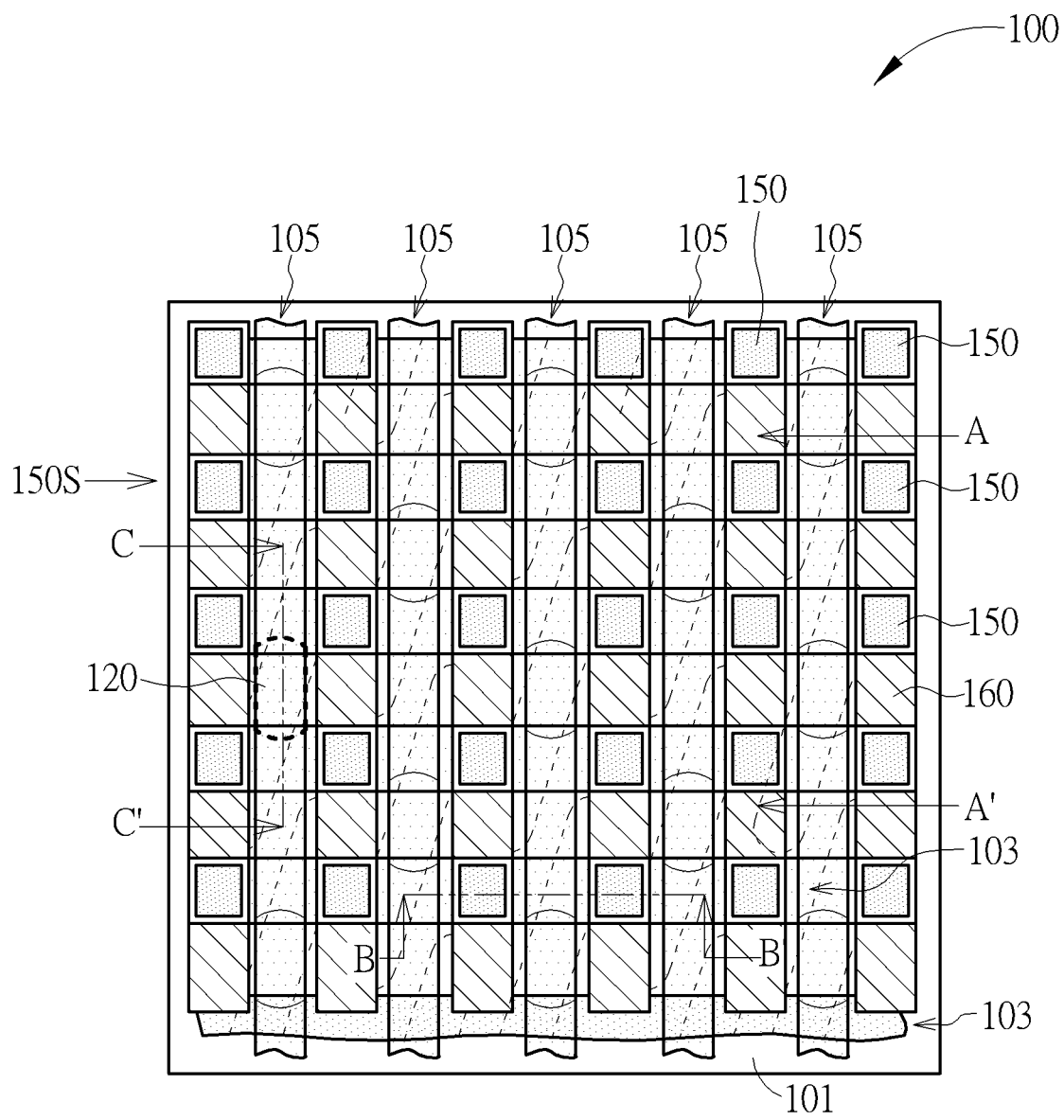
FIG. 16 is a schematic top view of the semiconductor memory device according to an embodiment of the present disclosure.

FIG. 16 illustrates a schematic top view of a semiconductor memory device 100 according to an embodiment of the present disclosure, where a storage contact (SC) 160 of a capacitor is formed between the insulating structures 150 and between the bit lines 105. As shown in FIG. 16, according to the embodiments of the present disclosure, the insulating structures 150 are disposed on the word line 103, and respectively disposed between the bit lines 105. The bit lines 105 and the insulating structures 150 are alternately disposed along the first direction (for example, the x-direction shown in FIG. 1). In addition, according to an embodiment of the present disclosure, some portions of the insulating structures 150 constitute strip-shaped insulating structures 150S, and each of the strip-shaped insulating structures 150S extends along the first direction (for example, the x-direction shown in FIG. 1). In the top view direction, the position of the strip-shaped insulating structure 150S substantially overlaps the position of the word line 103. In addition, in the top view direction, the bit line contacts 120 disposed under the bit line 105 are separated from each insulating structure 150. The storage contact 160 of the capacitor may have a stacked structure, for example, a stacked structure of double polysilicon layers, but not limited thereto.

Figure 17:
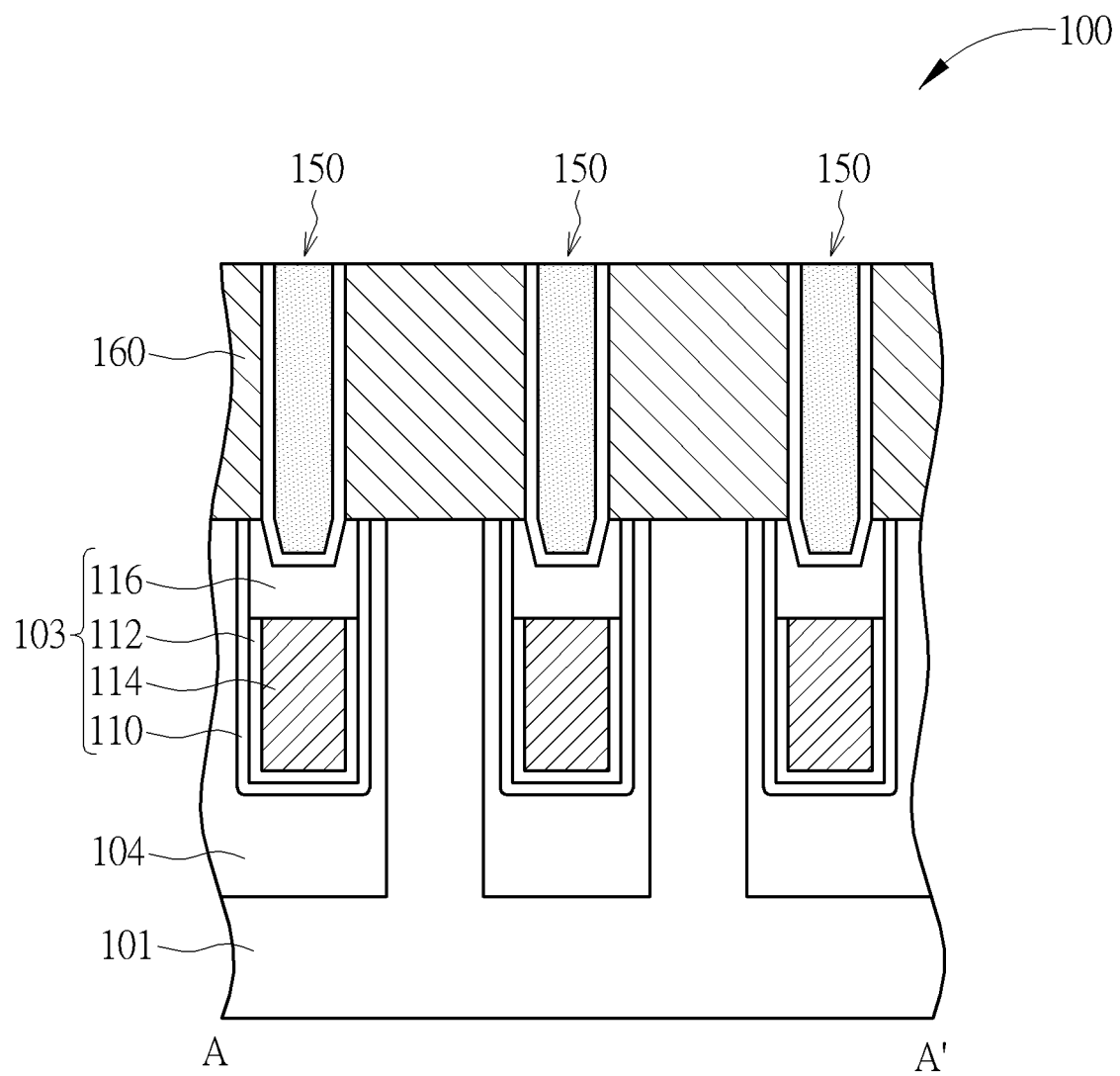
FIG. 17 is a schematic cross-sectional view of the semiconductor memory device along the section line A-A' of FIG. 16 according to an embodiment of the present disclosure.

FIG. 17 illustrates a schematic cross-sectional view of the semiconductor memory device 100 along the section line A-A' of FIG. 16 according to an embodiment of the present disclosure. As shown in FIG. 17, the storage contact 160 of the capacitor is formed between the insulating structures 150. The storage contact 160 may contact the active region 102 that is disposed below the storage contact 160, so that the active region 102 is electrically coupled to the capacitor (not shown) through the storage contact 160, where the capacitor is disposed on the storage contact 160. Along the section line A-A' of FIG. 16, the storage contact 160 of the capacitor is disposed between the adjacent insulating structures 150. According to the embodiments of the present disclosure, the bottom of the insulating structure 150 extends downward into the gate cap layer 116, so that the bottom surface of the insulating structure 150 is lower than the bottom surface of the storage contact 160, thereby providing a better electrical isolation effect for the adjacent storage contacts 160 and improving the reliability of the semiconductor memory device 100.

Figure 18:
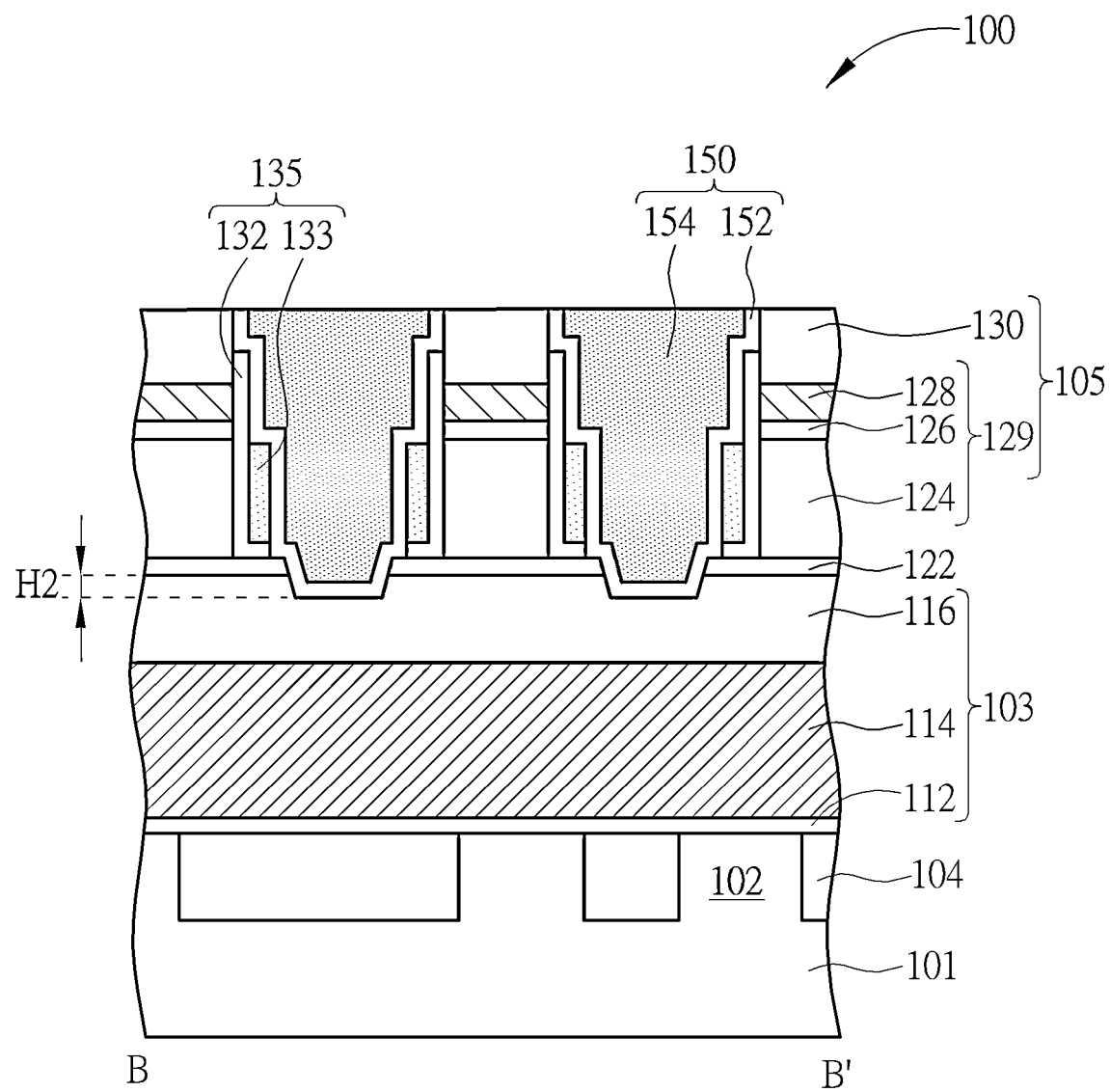
FIG. 18 is a schematic cross-sectional view of the semiconductor memory device along the section line B-B' of FIG. 16 according to an embodiment of the present disclosure.

FIG. 18 illustrates a schematic cross-sectional view of the semiconductor memory device 100 along the section line B-B' of FIG. 16 according to an embodiment of the present disclosure. The process stage of FIG. 18 is the same as the process stage of FIG. 17. As shown in FIG. 18, the area or the width of the cross section of the topmost surface of each insulating structure 150 is greater than the area or the width of the cross section of the bottommost surface of each insulating structure 150, or greater than the width of the contact surface between each insulating structure 150 and the gate cap layer 116. Two sidewalls of the conductive layer 129 of the bit line 105 are respectively covered by two adjacent insulating structures 150, and the spacer 135 is disposed between each insulating structure 150 and each bit line 105. In addition, the bottom of the insulating structure 150 extends downward into the gate cap layer 116. As shown in FIG. 18, the portion of the bottom of the insulating structure 150 in the gate cap layer 116 has a height H2, so that the bottom surface of the insulating structure 150 is lower the bottom surface of the bit line 105, or the bottommost surface of the insulating structure 150 is lower than the bottommost surface of the bit line contact 120. Therefore, in addition to the spacer 135 on the sidewall of the bit line 105, the insulating structure 150 of the embodiments of the present disclosure may further provide a better electrical isolation effect for the adjacent bit lines 105, thereby improving the reliability of the semiconductor memory device 100.

Figure 19:
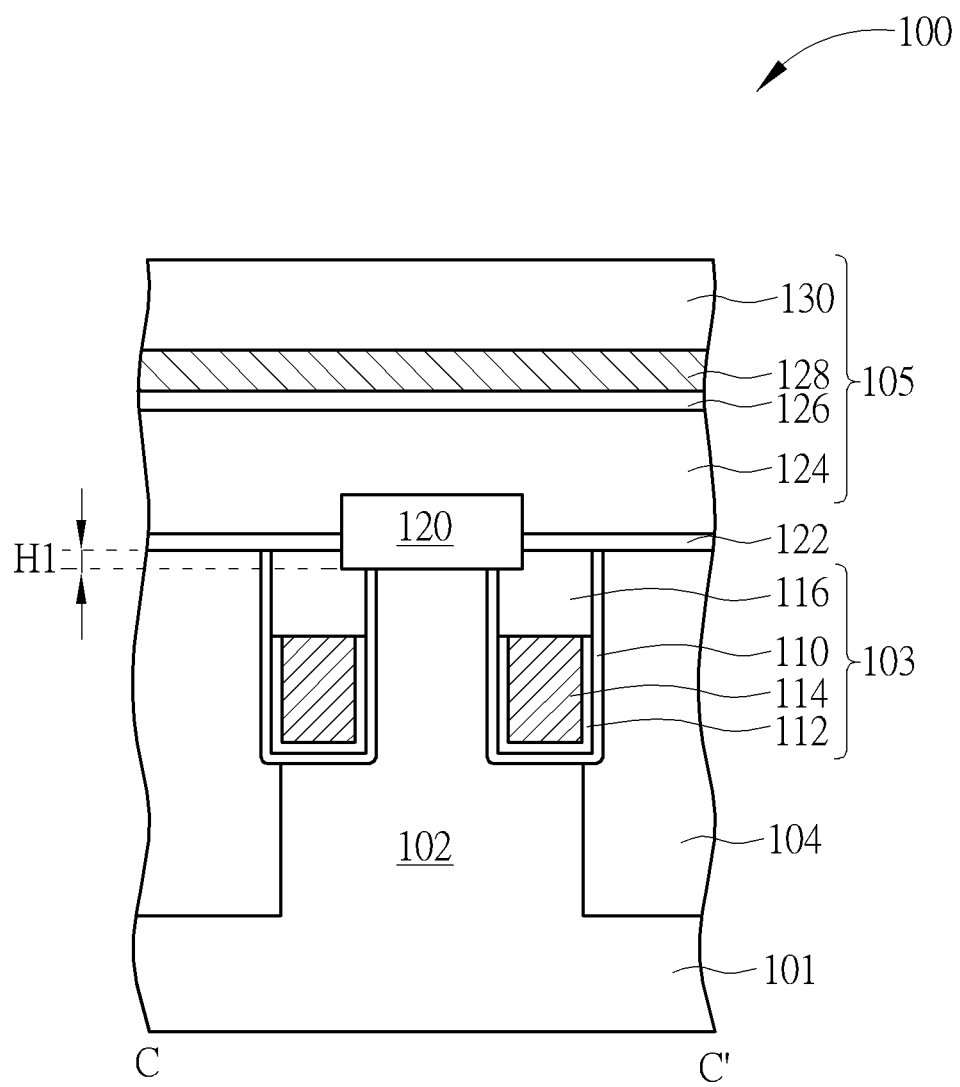
FIG. 19 is a schematic cross-sectional view of the semiconductor memory device along the section line C-C' of FIG. 16 according to an embodiment of the present disclosure.

FIG. 19 illustrates a schematic cross-sectional view of the semiconductor memory device 100 along the section line C-C' of FIG. 16 according to an embodiment of the present disclosure. The process stage of FIG. 19 is the same as the process stage of FIG. 17 and FIG. 18. As shown in FIG. 19, the material of the insulating structure 150 filling the recess on a partial top surface of the bit line hard mask 130 and a portion of the bit line hard mask 130 may be removed to form a flat top surface of the bit line hard mask 130. In addition, as shown in FIG. 19, a portion of the bottom of the bit line contact 120 disposed under the bit line 105 extends into the gate cap layer 116, and the portion of the bottom of the bit line contact 120 in the gate cap layer 116 has a height H1. Referring to FIG. 18 and FIG. 19 together, according to an embodiment of the present disclosure, the height H2 of the bottom of the insulating structure 150 in the gate cap layer 116 is greater than the height H1 of the bottom of the bit line contact 120 in the gate cap layer 116.

According to the embodiments of the present disclosure, the insulating structures between the storage contacts of the capacitors and between the bit lines are formed under simplified processes of forming the semiconductor memory devices, and the bottom of the insulating structure extends into the gate cap layer. For the semiconductor memory devices with reduced size and high integration density of memory units, the insulating structures provide a better electrical isolation effect between the storage contacts and between the bit lines, thereby improving the reliability of the semiconductor memory devices.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor memory device, comprising:
    a substrate;
    at least one word line, disposed in the substrate and extending along a first direction, wherein the word line includes a gate cap layer;
    a plurality of bit lines, disposed on the substrate and respectively extending along a second direction, wherein each of the bit lines crosses the word line, and each of the bit lines includes a conductive layer;
    a plurality of insulating structures, disposed above the word line and respectively disposed between the plurality of bit lines, wherein each of the bit lines includes a bit line hard mask, and each of the insulating structures directly contacts a sidewall of the bit line hard mask; and
    a plurality of spacers, each disposed between one of the insulating structures and one of the bit lines, wherein a top surface of each of the spacers is lower than a top surface of the bit line hard mask.

2. The semiconductor memory device of claim 1, wherein some portions of the plurality of insulating structures constitute a strip-shaped insulating structure and the strip-shaped insulating structure extends along the first direction.

3. The semiconductor memory device of claim 1, wherein each of the insulating structures directly contacts the gate cap layer of the word line.

4. The semiconductor memory device of claim 1, wherein a bottom surface of each of the insulating structures is lower than a top surface of the gate cap layer.

5. The semiconductor memory device of claim 1, wherein a bottom of each of the insulating structures is buried in the gate cap layer, and a width of a cross section of the bottom of each of the insulating structures is gradually decreased from top to bottom.

6. The semiconductor memory device of claim 1, wherein each of the insulating structures includes a stacked structure, the stacked structure includes a lower layer and an upper layer, and the lower layer is a conformally formed layer.

7. The semiconductor memory device of claim 1, wherein two sides of the conductive layer are respectively covered by the insulating structures.

8. The semiconductor memory device of claim 1, further comprising a spacer disposed between one of the insulating structures and one of the bit lines, wherein a thickness of the spacer is gradually increased from top to bottom.

9. The semiconductor memory device of claim 1, further comprising a plurality of bit line contacts, wherein the bit line contacts are separated from the insulating structures in a top view direction.

10. The semiconductor memory device of claim 9, wherein a bottommost surface of each of the insulating structures is lower than a bottommost surface of each of the bit line contacts.

11. The semiconductor memory device of claim 1, wherein the plurality of bit lines and the plurality of insulating structures are alternately disposed along the first direction.

12. A semiconductor memory device, comprising:
a substrate;
at least one word line, disposed in the substrate and extending along a first direction, wherein the word line includes a gate cap layer;
a plurality of bit lines, disposed on the substrate and respectively extending along a second direction, wherein each of the bit lines crosses the word line, and each of the bit lines includes a conductive layer; and
a plurality of insulating structures, disposed above the word line and respectively disposed between the plurality of bit lines, wherein each of the insulating structures includes a stacked structure, the stacked structure includes a lower layer and an upper layer, and a bottommost surface of the lower layer and a bottommost surface of the upper layer are in the gate cap layer.

13. A semiconductor memory device, comprising:
a substrate;
at least one word line, disposed in the substrate and extending along a first direction, wherein the word line includes a gate cap layer;
a plurality of bit line contacts, disposed in the substrate;
a plurality of bit lines, disposed on the plurality of bit line contacts and respectively extending along a second direction, wherein each of the bit lines crosses the word line, and each of the bit lines includes a conductive layer; and
a plurality of insulating structures, disposed above the word line and respectively disposed between the plurality of bit lines, wherein a bottommost surface of each of the insulating structures is lower than a bottommost surface of each of the bit line contacts.

14. A semiconductor memory device, comprising:
a substrate;
at least one word line, disposed in the substrate and extending along a first direction, wherein the word line includes a gate cap layer;
a plurality of bit lines, disposed on the substrate and respectively extending along a second direction, wherein each of the bit lines crosses the word line, and each of the bit lines includes a conductive layer;
a plurality of insulating structures, disposed above the word line and respectively disposed between the plurality of bit lines, wherein each of the bit lines includes a bit line hard mask, and each of the insulating structures directly contacts a sidewall of the bit line hard mask; and
a plurality of spacers, each disposed between one of the insulating structures and one of the bit lines.

15. The semiconductor memory device of claim 14, wherein each of the insulating structures directly contacts the gate cap layer of the word line.

16. The semiconductor memory device of claim 14, wherein a bottom of each of the insulating structures is buried in the gate cap layer, and a width of a cross section of the bottom of each of the insulating structures is gradually decreased from top to bottom.

17. The semiconductor memory device of claim 14, wherein a thickness of each of the spacer is gradually increased from top to bottom.

18. A semiconductor memory device, comprising:
a substrate;
at least one word line, disposed in the substrate and extending along a first direction, wherein the word line includes a gate cap layer;
a plurality of bit lines, disposed on the substrate and respectively extending along a second direction, wherein each of the bit lines crosses the word line, and each of the bit lines includes a conductive layer;
a plurality of insulating structures, disposed above the word line and respectively disposed between the plurality of bit lines, wherein each of the bit lines includes a bit line hard mask; and
a plurality of spacers, each disposed between one of the insulating structures and one of the bit lines, wherein each of the insulating structures directly contacts a top surface of each of the spacers.

19. The semiconductor memory device of claim 1, wherein a bottom surface of each of the insulating structures is lower than a top surface of the gate cap layer.

20. The semiconductor memory device of claim 1, wherein a thickness of each of the spacer is gradually increased from top to bottom.

* * * * *